United States Patent [19]
DeVries

[11] 3,988,703
[45] Oct. 26, 1976

[54] ACOUSTIC SURFACE WAVE DEVICE HAVING SPLIT-ISOLATED OR SPLIT-CONNECTED MULTISTRIP COUPLER

[75] Inventor: Adrian J. DeVries, Elmhurst, Ill.

[73] Assignee: Zenith Radio Corporation, Chicago, Ill.

[22] Filed: Dec. 31, 1975

[21] Appl. No.: 645,488

[52] U.S. Cl. .................................. 333/72; 310/9.8; 333/30 R
[51] Int. Cl.² ..................... H03H 9/26; H03H 9/04; H03H 9/32; H01L 41/10
[58] Field of Search .......................... 333/30 R, 72; 310/8–8.3, 9.5, 9.7, 9.8

[56] References Cited
UNITED STATES PATENTS

| | | | |
|---|---|---|---|
| 3,836,876 | 9/1974 | Marshall et al. | 333/72 X |
| 3,947,783 | 3/1976 | Maerfeld | 333/30 R |

Primary Examiner—Alfred E. Smith
Assistant Examiner—Marvin Nussbaum
Attorney, Agent, or Firm—Roy A. Ekstrand

[57] ABSTRACT

An acoustic surface wave filter has offset transmitting and receiving transducers formed on a wave propagating surface of a piezoelectric substrate. A multistrip coupler interposed between the transducers on the propagating surface includes a plurality of identical conductor groups forming coupler elements uniformly spaced on the surface and selectively attenuates either of the symmetrical or anti-symmetrical mode components of coupled waves within a predetermined range of acoustic wavelengths. In one embodiment, each conductor group includes electrically connected pairs which attenuates the symmetrical mode component while in another embodiment each conductor group includes a first continuous filamentary conductor and a second filamentary conductor having a discontinuity at its approximate center which attenuates the anti-symmetrical mode component.

19 Claims, 4 Drawing Figures

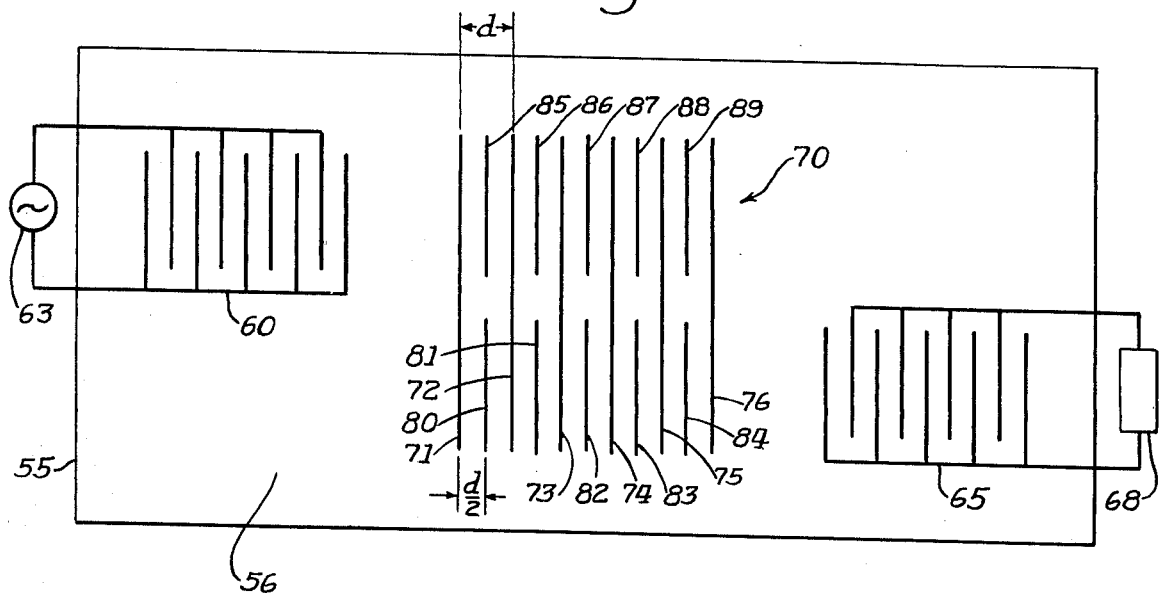
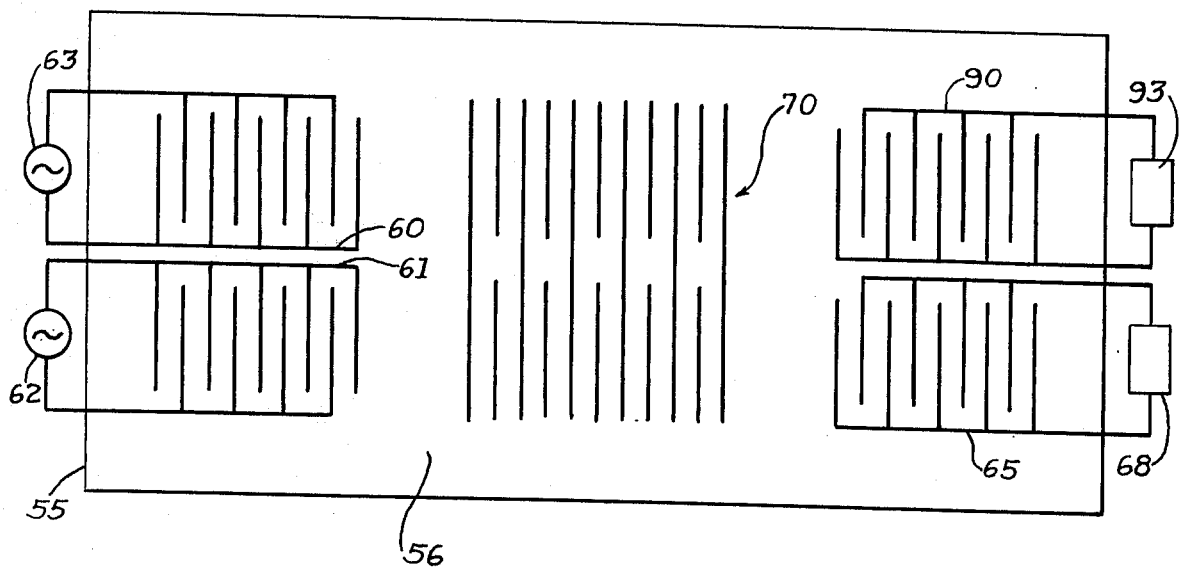

ACOUSTIC SURFACE WAVE DEVICE HAVING SPLIT-ISOLATED OR SPLIT-CONNECTED MULTISTRIP COUPLER

BACKGROUND OF THE INVENTION

This invention relates generally to surface wave integratable filters (SWIF's) and specifically to those utilizing multistrip couplers (MSC).

SWIF devices generally comprise piezoelectric substrates upon which transmitting and receiving transducer pairs are formed. The transducers, whether receiving or transmitting, are typically formed by pairs of electrically conductive comb-like structures having interleaved fingers. When a voltage is applied between the comb-like structures of a transmitting transducer, the piezoelectric material of the substrate's surface is stressed and deformed causing a conversion of electrical energy to mechanical energy in the form of acoustic surface waves which propagate across the medium surface to impinge the receiving transducer. A second energy conversion takes place at the receiving transducer in which a portion of the mechanical energy of the acoustic surface wave is reconverted to electrical energy, developing a voltage between comb elements.

While a simple single transducer section, formed by two adjacent fingers of one comb element and the interleaved finger of the other, is capable of launching or receiving surface waves, in practice many transducer sections are combined in a more complex transducer structure. In multiple section transducers, such as are generally used, the total launched or received wave is the cumulative effect of the individual transducer sections. Transducers define a single maximum energy or primary propagation and reception axis. While most propagation occurs along this axis, a small but significant amount is radiated in or received from other directions. Generally the primary axis is in essentially orthogonal alignment with the transducer fingers while these other energy transfer directions are non-orthogonal.

When electrically stimulated, transmitting transducers produce both surface waves (propagating at or near the medium surface) and bulk mode waves (propagating deep within the medium). Bulk mode waves are undesirable in surface wave devices because they often reflect off substrate boundaries and impinge the receiving transducer, causing spurious responses which often have a different time delay and exhibit a completely different frequency response.

The deleterious effect on the transfer function caused by the undesired bulk waves may be avoided by offsetting the transmitting and receiving transducers and sidestepping the wave propagation. In sidestepping SWIF devices, the transducers are laterally offset, that is, their primary axes are parallel but not coincident, and an interposed multistrip coupler is positioned orthogonal to the primary axes. Surface waves propagated along the primary axis of the transmitting transducer are "converted" to surface waves along the primary axis of the offset receiving transducer. Simply stated, the sidestepping effect of the multistrip coupler assures that surface waves launched by the transmitting transducer, which are offset by the multistrip coupler, reach the receiving transducer while bulk waves, which are not offset by the multistrip coupler, do not.

The action of such multistrip couplers is best described by analysis of the respective symmetric and antisymmetric mode components of the launched acoustic wave as it travels through the coupler. Once the acoustic wave is resolved into symmetric and antisymmetric mode components, their propagation can be considered individually and the total output wave derived by superposition of the individual mode components. Because the multistrip coupler elements are spaced periodically upon the propagating surface, the coupler has an inherent broad bandpass frequency characteristic with a stop band or "notch" for signals having acoustic wavelengths approximately twice the element spacing. The descriptions which follow relate to signals outside the coupler stop band.

As mentioned above, the primary axes of the transmitting and receiving transducers are parallel, but offset. The individual transducer primary axes define separate "tracks" or channels symmetrical about an imaginary center-line drawn through the coupler orthogonal to its element. The resultant structure is a first track through one half of the coupler in alignment with the transmitting transducer and a second track through the other half of the coupler in alignment with the receiving transducer.

A symmetrical mode component is a wave component distributed equally along an entire coupler element with the waves in both tracks in phase. An anti-symmetrical mode component is an acoustic wave having equal amplitude antiphase components in each track. When an anti-symmetrical mode wave is combined with a symmetrical mode wave of the same amplitude, the result resembles an acoustic surface wave in one half of the coupler array only, the two modes having a null effect in the other half. Hence an acoustic surface wave incident upon half the coupler array is resolvable into equal symmetrical mode and anti-symmetrical mode components.

The anti-symmetrical mode component tends to result in an anti-symmetrical voltage distribution across the coupler element causing a corresponding element current as the voltage distribution equalizes. In contrast, the symmetrical mode component produces a uniform voltage distribution across the element and no equalizing current is produced. The anti-symmetrical component has a slower propagation velocity than the symmetrical. As the two mode components advance through the coupler the propagational velocity difference gives rise to an increasing phase difference between the mode components. In the typical sidestepping device, the coupler is sufficiently long to develop a 180° phase disparity.

At this point all the acoustic energy originally emanating from the transmitting transducer propagating in the first track has been "switched over" and now propagates away from the coupler in the second track toward the receiving transducer.

The use of multistrip couplers to sidestep acoustic surface waves provides significant advantages over direct-line devices. However, considerably greater device flexiblity is attained if the coupler simultaneously performs additional functions.

OBJECTS OF THE INVENTION

It is a general object of the present invention to provide an improved more versatile acoustic surface wave device.

It is a more particular object of the present invention to provide an acoustic surface wave device having unique filtering properties.

SUMMARY OF THE INVENTION

An acoustic surface wave device has transmitting and receiving transducers and a multistrip coupler formed on a surface wave propagating medium. The coupler exhibits different effective element spacings under differing signal conditions thereby simultaneously producing the desired "sidestepping" of signals within the coupler passband and attenuating one of the symmetrical or anti-symmetrical mode components of signals within the coupler stop band and passing the other component unattenuated.

BRIEF DESCRIPTION OF THE DRAWINGS

The features of the present invention which are believed to be novel are set forth with particularity in the appended claims. The invention, together with further objects and advantages thereof, may best be understood by reference to the following description taken in conjunction with the accompanying drawings, in the several figures of which like reference numerals identify like elements, and in which:

FIG. 3 is a schematic representation of a surface wave filter constructed in accordance with the present invention utilizing a split-isolated coupler; and FIG. 4 depicts the device of FIG. 3 with an additional transducer pair.

DESCRIPTION OF THE PREFERRED EMBODIMENT

Figure 1:
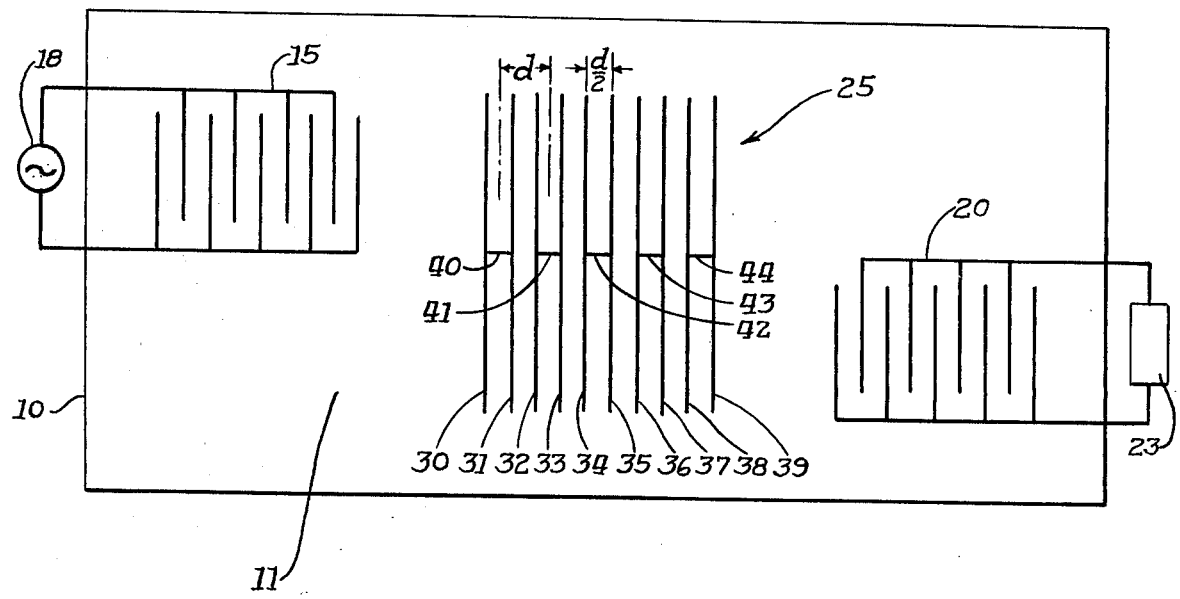
FIG. 1 is a schematic representation of a surface wave filter constructed in accordance with the present invention utilizing a split-connected coupler.

FIG. 1 shows a sidestepping acoustic surface wave integratable filter (SWIF) constructed in accordance with the present invention. A piezoelectric substrate 10 defines a substantially planar wave propagating surface 11 upon which a transmitting transducer 15 and receiving transducer 20, each comprising a pair of interleaved comb-like deposited metal structures, are formed in an offset configuration. A source of alternating signal 18 is connected to transducer 15 and a load 23 is connected to transducer 20. A split-connected multistrip coupler 25 comprises a plurality of elongated filamentary conductors 30–39 (spaced by a distance $d/2$) parallel to the fingers of transducers 15 and 20. A group of interconnecting stubs 40–44 provide electrical connections between alternate conductor pairs forming H-shaped filamentary pairs 30 and 31, 32 and 33, 34 and 35, 36 and 37 and 38 and 39. Each H-shaped structure comprises a mulitistrip coupler element, or section, spaced from each adjacent element by a distance $d$. It should be noted that the drawings are illustrative only and that in a practical structure many more elements, both in the coupler and the transducer, would generally be used. Further, the elements are not shown in true dimension.

In operation, signals within the coupler passband in the form of voltages produced by source 18, establish a time-varying potential between the interleaved halves of transducer 15 stressing the medium and launching acoustic surface waves. The launched waves propagate along a path orthogonal to the transducer fingers and the elements of coupler 25. The waves impinging the first track (the portion of coupler 25 in-line with transducer 15) are converted to the second track (the portion of coupler 25 in-line with transducer 20). At transducer 20 a voltage is developed and appears across load 23. As mentioned above, the length of coupler 25 is selected such that a 180° phase difference between the anti-symmetrical and symmetrical mode components exists, which is the condition for complete track switching.

The operation of coupler 25 for signals within the coupler stop band, that is, signals having acoustic wavelengths $2d$ (approximately twice the element spacing), however, differs from that of prior art couplers in that the symmetrical mode component is substantially attenuated while the anti-symmetrical mode component is passed virtually unattenuated. The discussions which follow will describe the split-connected coupler operation in this relatively narrow stop-band in greater detail. However, it need only be noted here that surface waves within the coupler passband are sidestepped by coupler 25 and impinge receiving transducer 20 substantially unaltered. In contrast, signals within the coupler stop band impinging receiving transducer 20 are altered with the symmetrical mode component being greatly attenuated with respect to the anti-symmetrical mode component.

Before analyzing the operation of the coupler 25 for signals within the stop band in detail, some general discussion of the reflection mechanism within surface couplers may be helpful. Surface wave reflection is primarily due to two mechanisms, acting alone or in combination. The first is purely electrical in nature and occurs whenever a potential difference exists between adjacent conductors on the medium surface. Functioning as a simple transducer, the coupler elements launch a forward-going (direct) wave and a reverse-going (reflected) wave. The second reflection mechanism is a combination of mechanical and electrical effects and is due to the discontinuity caused by the presence of the coupler element itself. It is independent of inter-element voltages. When a surface wave encounters such a discontinuity, a portion of the wave energy is reflected back. Regardless of the caused mechanism if the reverse-going waves are cumulative, due to the particular periodicity of the coupler, the coupler is reflective.

With this elementary understanding of wave reflection, the behavior of coupler 25 for signals within the stop-band will now be described by use of familiar superposition principles. The propagation of acoustic waves, emanating from the transducer 15, through coupler 25 will be described by separating the symmetrical and anti-symmetrical mode components, considering their individual behavior and adding their effects. In addition, the analysis of each mode component reflection will be further divided into discussion of both reflection mechanisms.

Considering the discontinuity mechanism during the propagation of a symmetrical mode component, incidence with each respective filamentary conductor gives rise to a continuing component and a reflected component. As successive symmetrical mode waves travel through the coupler a progression of forwardgoing acoustic waves arises together with a progression of reverse-going or reflected components. However, because the spacing between filamentary conductors 30–39 is equal to one quarter of an acoustic wavelength, successive reflected components are displaced by half wavelengths (two travel times) and are cancelled. As a result, the reflected components due to surface discontinuity for symmetrical mode components are cumulatively cancelled.

A different situation arises, however, for reflected waves produced by the "purely electrical" mechanism. As mentioned, symmetrical mode components encountering a coupler element produce an even voltage distribution across the element. Because the filamentary conductors are paired, that is, electrically connected, a symmetrical mode wave impinging the first conductor of each pair raises the entire H-shaped coupler element to a uniform potential. For example, a wave impinging conductor 30 produces a voltage which, due to connecting stub 40, is also applied to conductor 31. Similarly a wave incident on conductor 32 simultaneously raises conductor 34 to the same potential due to connecting stub 41, and so on. As a result, the H-like elements of the coupler appear electrically similar to a solid coupler element, and have an effective spacing of one half wavelength. As successive symmetrical wave fronts travel through the coupler, voltages between the coupler elements are produced. Due to these inter-element voltages forward-going and reverse-going waves described above are launched by a transducer action. The half wavelength effective spacing between elements causes successive reflected waves to be in phase (two travel times) and the structure becomes reflective. The percentage of energy reflected is a function of the number of coupler elements. In a practical structure having a coupler length sufficient for track switching of signals within the passband, substantial attenuation of stop band symmetrical mode components result.

Turning now to anti-symmetrical mode component propagation, a similar analysis to that carried out for discontinuity reflections yields a similar result. The incidence of a succession of anti-symmetrical mode waves upon conductors 30–39 gives rise to a succession of reflected waves which cancel due to the quarter wavelength spacing of conductors 30–39. As mentioned above, anti-symmetrical mode components produce equal antiphase waves within coupler 25 which tend to induce equal and opposite voltage contributions in each half of the coupler element. The combination of equal magnitude — opposite polarity voltages across the coupler element produces zero voltage. In the absence of any voltage produced at the coupler elements, there is no transducer action and neither forward-going or reverse-going waves are launched. Thus the anti-symmetrical mode components propagate through coupler 25 unattenuated. The resultant wave leaving coupler 25, obtained by addition of the symmetrical and anti-symmetrical mode contributions, has a substantially greater anti-symmetrical than symmetrical mode component.

Figure 2:
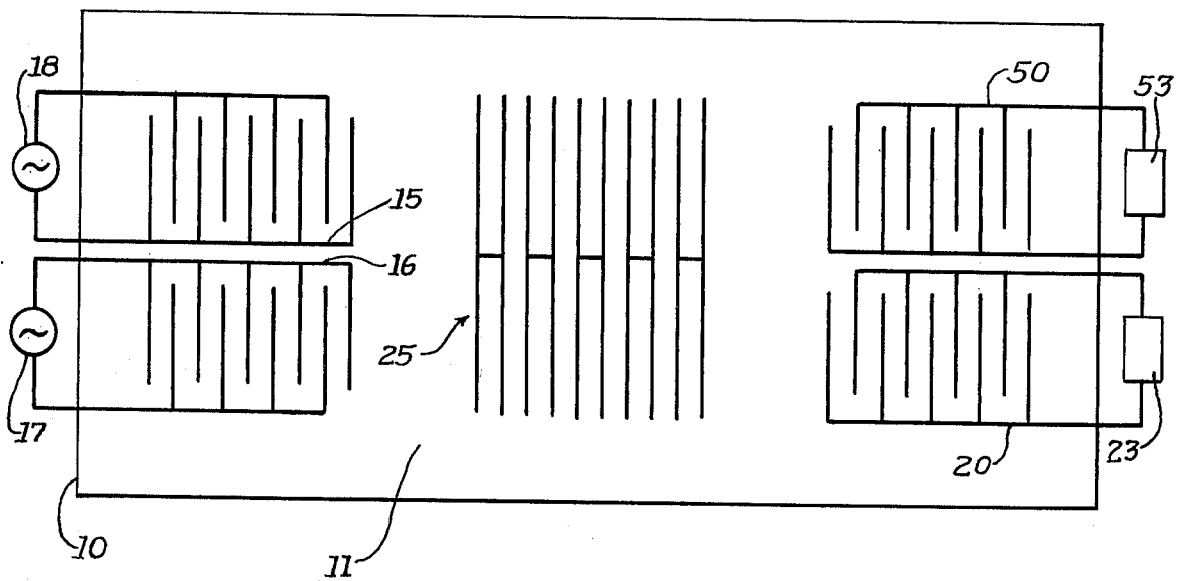
FIG. 2 depicts the device of FIG. 1 with an additional transducer pair.

FIG. 2 shows an alternate embodiment of the present invention acoustic surface wave device. Substrate 10, propagating surface 11, transducers 15 and 20 as well as load 23 and source 18 together with coupler 25 are indentical in structure and function to their counterparts in FIG. 1. The device of FIG. 2 differs in that a second transmitting transducer 16 and receiving transducer 50, both similar in structure to transducers 15 and 20, are formed on surface 11. A source of signal 17 is connected to transducer 16 and a load 53 is coupled to transducer 50.

In operation, signals within the normal passband launched by transducer 15 propagate through coupler 25 and, via the familiar track switching process, impinge receiving transducer 20 exclusively. Similarly, surface waves launched by transducer 16 propagate through coupler 25 and are track switched to exclusively impinge transducer 50. As mentioned, the antisymmetrical component of signals within the coupler stop band will propagate virtually unattenuated through coupler 25 while the symmetrical mode component will be substantially attenuated.

If, for example, surface waves within the stop band are launched by transducer 15, the waves impinging transducers 20 and 50 will include substantially greater anti-symmetrical than symmetrical components and are not replicas of the signals lauched by transducer 15. Because the anti-symmetrical component comprises equal antiphase signals in each track, or coupler half, transducers 20 and 50 will be driven differentially as to signals within the stop band while the entire energy of signals within the passband will be exclusively applied to transducer 20. The result is an acoustic surface wave device which couples signals within the passband exclusively to one of the transducers and drives both receiving transducers differentially for signals within the stop band. Of course, the same operation is obtained if transducer 16 rather than 15 is driven by the signal.

Simultaneous use of all four transducers provides even greater flexibility. If transducers 15 and 16 are simultaneously driven, the phase relationship between their respective signal sources 17 and 18 determines the mode of signal launched. When sources 17 and 18 are in-phase a symmetrical mode wave is launched and when out-of-phase by 180° an anti-symmetrical mode wave is launched. Because symmetrical mode components are substantially attenuated by coupler 25, whereas anti-symmetrical mode components are attenuated very little, either a differential signal or a greatly attenuated common mode signal is produced by transducers 20 and 50 by simply selecting the relative phases of sources 17 and 18.

FIG. 3 shows a "dual" embodiment of the present invention. A piezoelectric substrate 55 defines a substantially planar wave propagating surface 56 upon which a transmitting transducer 60 and receiving transducer 65, each comprising a pair of interleaved comb-like deposited metal structures, are formed in an offset configuration. A source of alternating signal 63 is connected to transducer 60 and a load 68 is connected to transducer 65. A split-isolated multistrip coupler 70 comprises a plurality of elongated filamentary conductors 71–76 spaced by a distance d and parallel to the fingers of transducers 60 and 65. A second group of filamentary conductors 80–89 having a length approximately half that of conductors 71–76 are interleaved between adjacent pairs of conductors 71–76 and spaced d/2 from adjacent full-length conductors. Each conductor triad comprising one full-length and two adjacent half-length conductors forms a multistrip coupler element, or section. The center-to-center spacing between elements equals distance d.

The operation of this filter, for signals within the coupler passband, is essentially the same as for the previously described filters. Voltages produced by source 63 drive transducer 60 to stress the medium and launch acoustic surface waves. The launched waves propagate, along a path orthongonal to the transducer fingers and the elements of coupler 70, impinging the first track (the portion of coupler 70 in-line with transducer 60) and are converted to the second track (the portion of coupler 70 in-line with transducer 65). Voltage developed at transducer 65 appears across load 68.

The length of coupler 70 is sufficient to produce the track switching 180° phase difference between the anti-symmetrical and symmetrical mode components.

The operation of coupler 70 for signals within the coupler stop band differs from that of prior art couplers in that the anti-symmetrical mode component is substantially attenuated while the symmetrical mode component is passed virtually unattenuated. In other words surface waves, resulting from signals within the coupler passband, propagating through coupler 70 are sidestepped and impinge receiving transducer 65 substantially unaltered while signals within the coupler stop band experience a substantial decrease in anti-symmetrical mode component and a substantially unchanged symmetrical mode component. It should be evident that this is opposite of the split-connected coupler 25 in FIGS. 1 and 2 making split-isolated coupler 70 in effect the dual of coupler 25.

Bearing in mind the previous discussions of wave reflection, the behavior of coupler 70 for signals within the stop band will be described by use of superposition principles, by separation into symmetrical and anti-symmetrical mode components and addition of their effects. As before, reflection analysis will consider both mechanical and electrical reflection mechanisms.

Consider the discontinuity mechanism. A symmetrical mode component incident upon either a full-length conductor such as 71 or a half-length conductor pair such as 80 and 85 gives rise to a forward-going component (that portion of the incident wave not reflected) traveling on after striking the filamentary element and a reflected component. As successive symmetrical mode waves travel through the coupler, a progression of forwardgoing acoustic waves arises, together with a pregression of reverse-going or reflected waves. Because both full-length and pairs of half-length conductors produce reflections, the effective spacing between reflecting conductors is equal to one quarter of an acoustic wavelength. As a result successive reflected components are displaced by half wavelengths (two travel times) and are cancelled and no reflection of symmetrical mode components due to discontinuities occur.

A similar situation arises for reflected waves produced by the purely electrical mechanism. Symmetrical mode components encountering either a full-length or half-length conductor pair produce an even voltage distribution. In other words because the wave is symmetrical, a full-length conductor and an in-line half-length conductor pair act electrically the same. For example, a wave impinging conductor 71 raises it to a uniform voltage. A symmetrical wave impinging conductor pair 80 and 85 also raises them simultaneously to a uniform voltage. Similarly a wave incident on conductor 72 creates a voltage between it and conductor pairs 80–85 and 81–86. As successive symmetrical wave fronts travel through the coupler, voltages between the conductors are produced giving rise to transducer action and launching forward-going and reverse-going waves. The quarter wavelength spacing between conductors causes successive reflected waves to be 180° out-of-phase (two travel times) cancelling all reflections.

Turning now to anti-symmetrical mode component propagation, a similar analysis to that carried out above for reflections due to discontinuities yields a similar result. The incidence of successive anti-symmetrical mode waves on full-length conductors 71–76 and half-length conductors 80–89 gives rise to a succession of reflected waves which cancel due to the quarter wavelength conductor spacing.

As mentioned above, anti-symmetrical mode components comprise equal antiphase waves within the coupler which induce equal and opposite voltages in each half of the coupler conductors. In the case of a full-length conductor, the equal and opposite polarity voltages across the couler element add to zero. In half-length conductors, however, no combination takes place and each half is raised to a voltage with respect to adjacent half-length conductors. Each half-length pair, therefore, is energized. Because the spacing between adjacent half-length conductors is one half wavelength, reflected waves are in-phase and the coupler is reflective. The resultant wave leaving coupler 70, obtained by addition of the symmetrical and anti-symmetrical mode contributions, has a substantially greater symmetrical than anti-symmetrical mode component.

FIG. 4 shows an alternate embodiment of the acoustic surface wave device shown in FIG. 3. Substrate 55, propagating surface 56, transducers 60 and 65 as well as load 68 and source 63 together with split-isolated coupler 70 are identical in structure and function to those described in FIG. 3. The device of FIG. 4 differs in that a second transmitting transducer 61 and receiving transducer 90 both similar in structure to transducers 60 and 65 are formed on surface 56. A source of signal 62 is connected to transducer 61 and a load 93 is coupled to transducer 90.

In operation, signals within the normal passband launched by transducer 60 propagate through coupler 70 and, via the familiar track switching process, impinge receiving transducer 65 exclusively. Similarly, surface waves launched by transducer 61 will progagate through coupler 70 and be track switched to exclusively impinge transducer 90. As mentioned, the symmetrical mode components of signals within the coupler stop band will propagate virtually unattenuated through coupler 70 while the anti-symmetrical mode components will be substantially attenuated.

If, for example, surface waves within the stop band are launched by transducer 60 the waves impinging transducers 65 and 90 will include substantially greater symmetrical than anti-symmetrical components and will not be replicas of the originally launched signals. The unattenuated symmetrical mode component will produce like polarity, equal reactions in transducers 65 and 90. The result is an acoustic surface wave device which couples signals within the passband exclusively to one of the transducers and to both receiving transducers for signals within the stop band. Of course, the same operation is obtained if transducer 61 rather than 60 is driven by the signal.

As mentioned in the discussion of split-connected devices, simultaneous use of all four transducers provides even greater flexibility. If transducers 60 and 61 are simultaneously driven, the phase relationship between their respective signal sources 62 and 63 will determine the mode of signal launched. When sources 62 and 63 are in-phase a symmetrical mode wave is launched and when out-of-phase by 180° an anti-symmetrical mode wave is launched. Because symmetrical mode components are unattenuated by coupler 70 whereas anti-symmetrical mode components are substantially attenuated, either an attenuated differential signal or an unattenuated common mode signal is produced by transducers 65 and 90 as a function of the relative phase of sources 62 and 63.

What has been shown is a novel mulitstrip coupled acoustic surface wave device which provides sidestepping of surface waves within the coupler passband. In addition, the devices shown exhibit increased flexibility for signals within the coupler stop band by selectively attenuating one mode component while coupling the other unattenuated.

While particular embodiments of the invention have been shown and described, it will be obvious to those skilled in the art that changes and modifications may be made without departing from the invention in its broader aspects, and, therefore, the aim in the appended claims is to cover all such changes and modifications as fall within the true spirit and scope of the invention.

What is claimed is:
1. An acoustic surface wave device comprising:
   a piezoelectric substrate defining a wave propagating surface;
   transmitting transducer means formed on said surface for launching acoustic surface waves, said launched waves being resolvable into symmetrical and anti-symmetrical mode components;
   receiving transducer means formed on said surface converting a substantial portion of the acoustic energy of impinging acoustic surface waves into electrical energy; and
   coupling means located in the surface wave propagation path between said transducer means substantially attenuating one of said mode components for surface waves having acoustic wavelengths within a predetermined range while coupling the other of said mode components substantially unattenuated.
2. An acoustic surface wave device as set forth in claim 1, wherein said coupling means include a plurality of elongated metallic elements formed on said surface.
3. An acoustic surface wave device as set forth in claim 2, wherein said elongated metallic elements each include a first portion substantially orthogonal to the direction of acoustic energy travel for surface waves emanating from said transmitting transducer means and a second portion substantially orthogonal to the direction of energy travel for surface waves impinging said receiving transducer means.
4. An acoustic surface wave device as set forth in claim 3, wherein said elongated metallic elements are substantially linear and wherein said directions of acoustic energy travel for said launched and impinging waves are substantially parallel.
5. An acoustic surface wave device as set forth in claim 4, wherein said elongated metallic elements are substantially parallel and wherein said transmitting transducer means and said receiving transducer means are positioned in an offset configuration.
6. An acoustic surface wave device as set forth in claim 5, wherein each of said elongated metallic elements includes a pair of substantially parallel electrically connected filamentary conductors, said coupling means substantially attenuating said symmetrical mode component and coupling said anti-symmetrical mode component substantially unattenuated.
7. An acoustic surface wave device as set forth in claim 6, wherein the center-to-center spacing between said pairs is substantially equal to one half the acoustic wavelength of surface waves within said predetermined range.
8. An acoustic surface wave range as set forth in claim 7, further including second receiving transducer means positioned in line with said transmitting transducer means.
9. An acoustic surface wave device as set forth in claim 5, wherein each of said elongated metallic elements includes first, second and third filamentary conductors, said second and third filamentary conductors parallel to and equidistant from said first filamentary conductor having a combined length slightly less than said first conductor, said coupling means substantially attenuating said anti-symmetrical mode component and coupling said symmetrical mode component substantially unattenuated.
10. An acoustic surface wave device as set forth in claim 9, wherein the center-to-center spacing between said elongated metallic elements is substantially equal to one half the acoustic wavelength of surface waves within said predetermined range.
11. An acoustic surface wave device as set forth in claim 10, further including second receiving transducer means positioned in line with said transmitting transducer means.
12. An acoustic surface wave device comprising:
   a piezoelectric substrate defining a wave propagating surface;
   transmitting and receiving transducer means on said surface launching and receiving acoustic surface waves, said waves resolvable into symmetrical and anti-symmetrical mode components; and
   multistrip coupling means interposed between said transducer means including a plurality of coupler elements periodically spaced on said surface, the effective periodicity of said elements for signals having acoustic wavelengths within a predetermined range being different for said mode components causing said coupler to reflect only one of said mode components.
13. An acoustic surface wave device as set forth in claim 12, wherein said effective periodicity of said coupler elements for signals within said predetermined range is one fourth the acoustic wavelength for one of said mode components and one half the acoustic wavelength for the other of said mode components.
14. An acoustic surface wave device as set forth in claim 13, wherein each of said coupler elements includes an indentical group of filamentary conductors.
15. An acoustic surface wave device as set forth in claim 14, wheren said transmitting and receiving transducer means are offset with respect to said multistrip coupling means.
16. An acoustic surface wave device as set forth in claim 15, wherein said effective periodicity is one half an acoustical wavelength for said symmetrical mode component and wherein said symmetrical mode component is attenuated.
17. An acoustic surface wave device as set forth in claim 16, wherein said groups of filamentary conductors each include an electrically connected pair of conductors spaced apart one fourth of the acoustic wavelength of signals within said predetermined range.
18. An acoustic surface wave device as set forth in claim 15, wherein said effective periodicity is one half an acoustical wavelength for said anti-symmetrical mode component and wherein said anti-symmetrical mode component is attenuated.
19. An acoustic surface wave device as set forth in claim 18, wherein said groups of filament conductors each include a first continuous conductor and a second conductor having a discontinuity at its approximate center, said first and second conductors being spaced apart one fourth of the acoustical wavelength of signals within said predetermined range.

* * * * *